United States Patent [19]

Chapman

[11] 4,412,331
[45] Oct. 25, 1983

[54] FEEDBACK CIRCUIT FOR CONTROLLING THE PEAK OPTICAL OUTPUT POWER OF AN INJECTION LASER

[75] Inventor: Lynn C. Chapman, Gaithersburg, Md.

[73] Assignee: M/A-COM DCC, Inc., Germantown, Md.

[21] Appl. No.: 256,466

[22] Filed: Apr. 22, 1981

[51] Int. Cl.³ .............................................. H01S 3/00
[52] U.S. Cl. ...................................... 372/29; 372/46; 372/38
[58] Field of Search ............................. 372/46, 38, 29

[56] References Cited

U.S. PATENT DOCUMENTS

| | | | |
|---|---|---|---|
| 4,009,385 | 2/1977 | Sell | 372/38 |
| 4,305,047 | 12/1981 | Chapman et al. | 372/46 |
| 4,348,648 | 9/1982 | Childs | 372/29 |
| 4,355,395 | 10/1982 | Salter | 372/38 |
| 4,359,773 | 11/1982 | Scoastz | 372/29 |

Primary Examiner—William L. Sikes
Assistant Examiner—Leon Scott, Jr.
Attorney, Agent, or Firm—Pollock, Vande Sande & Priddy

[57] ABSTRACT

An injection laser is turned on and off in response to DATA and $\overline{\text{DATA}}$ control signals. A photodiode is irradiated by the laser and passes current that is proportional to the intensity of the laser radiation. A current switch responds to the $\overline{\text{DATA}}$ signal to define a current path for the source current of associated source current transistors when the laser is on. A difference current, corresponding to the difference between the photodiode current and the source current, is then applied to an integrator. The integrator generates an error signal corresponding to the difference in charge transfer between the photodiode and the source current transistors. The error signal is applied to operate a bias transistor that generates a corresponding DC bias current for the laser.

4 Claims, 2 Drawing Figures

FEEDBACK CIRCUIT FOR CONTROLLING THE PEAK OPTICAL OUTPUT POWER OF AN INJECTION LASER

DESCRIPTION

1. Technical Field

The invention relates to a feedback circuit for controlling the peak optical output power of an injection laser and, more particularly, to such a circuit that includes means for controlling the DC bias current of the laser in response to laser output in only one of two laser states.

2. Related Application

This is an improvement of prior copending application Ser. No. 83,121 filed Oct. 9, 1979 and now U.S. Pat. No. 4,305,047 assigned to the assignee of this application.

BACKGROUND ART

Injection lasers have been proposed as a radiation source which can be used to transmit information by modulating the laser driving current with data signals representing the intelligence to be transmitted. Such lasers have a nonlinear operating characteristic wherein optical output increases slowly with increases in driving current up to a threshold, above which threshold, optical output increases more rapidly with respect to driving current. To satisfy the joint requirements of maximizing the signal to noise ratio and the on/off ratio, it has been proposed to operate the laser at the "knee" of the operating characteristic.

Thus, the laser driving current is composed of a DC bias current and a data signal current, and desirably the DC bias current operates the laser at the "knee" of the characteristic.

In prior art laser control systems, for example as disclosed in "Bell System Technical Journal", Vol. 57, No. 6, (July–August, 1978), it is known to control laser output by irradiating a photodiode with a pulsed laser and applying the corresponding current output of the photodiode to an RC filter circuit that generates a delayed signal corresponding to the average power of the laser. The average power signal is then compared to a reference power signal and a corresponding error signal is generated and is applied to control the DC bias current of the laser.

Such prior art feedback control circuits have the disadvantage that the DC bias current is generated in response to an average power measurement and, therefore, the bias current is influenced by the data pattern being transmitted.

Thus, prior art laser control systems do not operate efficiently when the laser is held in a particular operational state for a period of time and is then switched to the opposite operational state. For example, if a laser is maintained in an on state, the RC filter circuit of a prior art control system will generate an average power signal and a corresponding DC bias current that is too high for the laser's continuous state of operation, since the prior art circuit cannot distinguish a laser that is continuously on and a laser that is intermittently turned on at a relatively high level. Furthermore, when the laser is turned off, the DC bias current will be maintained at an excessively high level for a period of time corresponding to the RC time constant of the filter circuit.

Alternatively, if the laser is maintained in an off state for a period of time, and, thereafter, the laser is turned on again, the prior art control circuit will not initially provide a sufficiently high DC bias current since the average power signal of the circuit will not reflect the instantaneous value of the optical output of the laser.

Prior art systems also have the disadvantage that a relatively high back bias voltage, for example, 10 to 20 volts, is required for a photodiode in order to ensure that a sufficiently distinctive waveform is provided at the output of the photodiode in response to the radiation of the laser.

Accordingly, it is a primary object of the invention to provide a feedback circuit for controlling the peak optical output power rather than the average optical output power of an injection laser.

A further object of the invention is to provide a feedback control circuit that operates to generate a DC bias feedback current that closely follows the operational "on" condition of a laser despite changes in the duty cycle or pattern of the operational on/off data signals for the laser.

Another object of the invention is to provide a feedback control circuit for controlling the peak optical output of a laser wherein a photodiode is operated with a relatively small reverse bias voltage.

A further object of the invention is to provide a feedback control circuit that holds the peak optical output of a laser constant when a loss of data occurs and that maintains a constant output until a data input is resumed.

These and other objects of this invention will become apparent from a review of the detailed specification which follows and a consideration of the accompanying drawings.

DISCLOSURE OF THE INVENTION

In order to achieve the objects of the invention and to overcome the problems of the prior art, the circuit for controlling the peak optical output power of an injection laser, according to the invention, includes a controlled source of DC bias current for the laser and transistors for turning on and off the laser in response to DATA and $\overline{\text{DATA}}$ signals, with a photodiode for passing current that is proportional to the intensity of the laser radiation. A current switch comprised of two Schottky diodes responds to the $\overline{\text{DATA}}$ signal to define a current path for an associated "laser on" current source when the laser is on. A difference current, corresponding to the difference between the photodiode current and the current of the "laser on" source, is then applied to an integrator.

The integrator integrates the difference current and stores an error signal corresponding to the total difference in charge transfer between the photodiode and the current source. The error signal is applied by the integrator to a DC bias control transistor that applies a corresponding DC bias current to the injection laser.

When the laser is operated in an off state in response to a $\overline{\text{DATA}}$ signal, the current switch is operated to block the flow of low level photodiode current through the current source and to shunt the low level current of the photodiode to a minus voltage portion of the circuit.

In the embodiment of the invention just described a pair of current sources are used, a first, on all the time for current corresponding to the laser current in the "off" condition (the bias current), and a second, switched current source, for current corresponding to the difference in bias and on current.

In another embodiment the first or non-switched current source has a current equal to the laser on current while the switched source carries a current corresponding to the difference between "on" and "off" current. Of course, in this second embodiment the switching of the switched source is just the inverse of the switching of the switched source in the first embodiment. Accordingly, the two embodiments produce equivalent resulting control action.

BEST MODE FOR CARRYING OUT THE INVENTION

Figure 1:
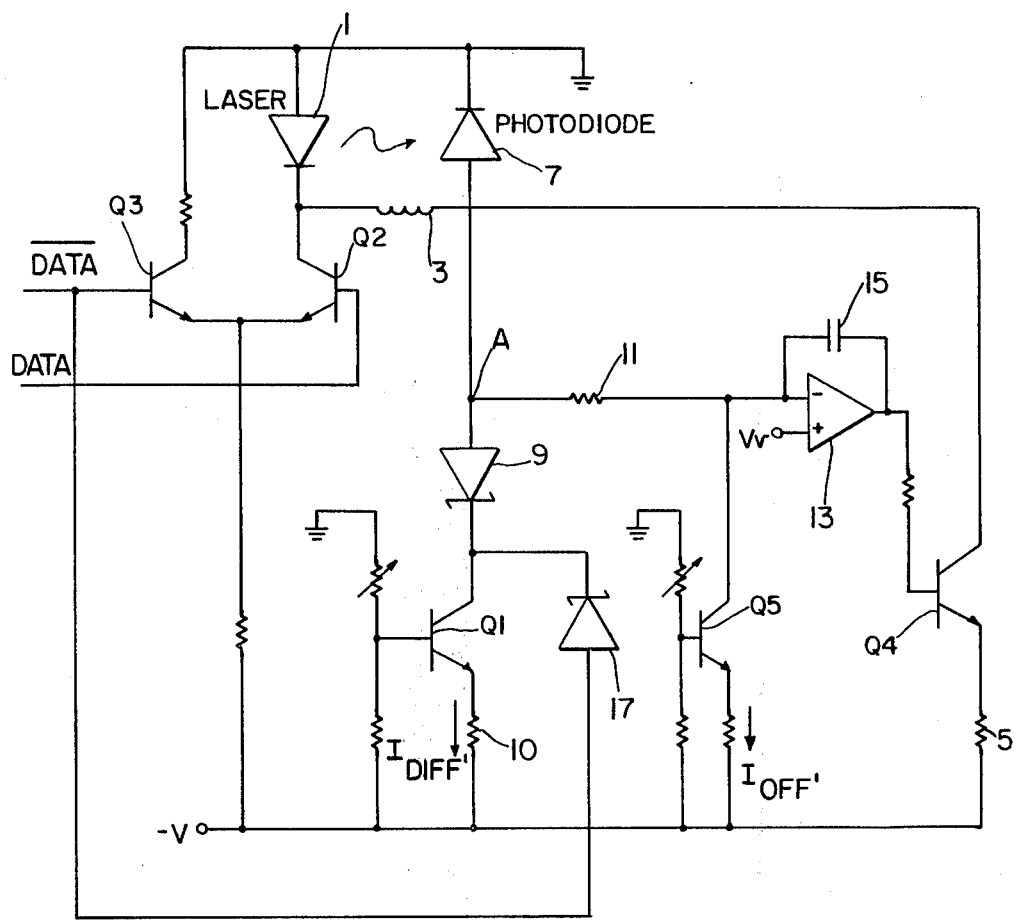
FIG. 1 illustrates a circuit diagram of a first embodiment of an apparatus for controlling the peak optical output power of an injection laser.

The remaining portion of this specification will describe preferred embodiments of the invention when read in conjunction with the attacheed drawings, in which like reference characters identify identical apparatus.

FIG. 1 illustrates a circuit diagram of a feedback circuit for controlling the peak optical output power of an injection laser 1 that is turned on and off in response to data input signals. In operation, the laser 1 is turned on in response to a DATA input signal that is applied at the base of a transistor Q2 to turn on the transistor and to thereby cause driving current to be applied to the laser. This driving current and a DC bias current through an inductor 3, a transistor Q4 and a resistor 5, drive the injection laser 1. The laser is turned off in response to a $\overline{\text{DATA}}$ signal that is applied at the base of the transistor Q3 to turn on the transistor and to thereby cause current to be shunted around the laser 1.

It will be appreciated by those skilled in the art that the $\overline{\text{DATA}}$ signal is merely an inverted DATA signal and, therefore, the transistor Q2 and Q3 cannot be activated simultaneously.

It will also be appreciated by those skilled in the art that the optical output of the injection laser 1 increases rapidly in response to increments of input driving current above a particular threshold current level. Current applied at or below the threshold level results in only a small optical output. Accordingly, in order to operate the injection laser 1 efficiently, it is necessary to apply a DC bias current to ensure that increments of driving current for the laser will be applied above the threshold current level. As the laser 1 is turned on and off in response to DATA and $\overline{\text{DATA}}$ signals, it is desirable to control the peak optical output of the laser by adjusting the DC bias current when the laser is on.

The DC bias current for the injection laser 1 is determined by the amount of current that flows through the inductor 3 and the corresponding transistor Q4 and resistor 5. The transistor Q4 is controlled in accordance with the invention to provide a particular DC bias current for the injection laser 1 which bias current is adjusted when the laser is turned on.

More particularly, when the laser is turned on in response to conduction in transistor Q2, a portion of the output of the laser is optically coupled to photodiode 7. The photodiode 7 passes a particular electrical current that is proportional to the intensity of the incident laser radiation, and the current is split at a node A into a current $I_{DIFF}$ and an "off" current $I_{OFF}$. Typically, the $I_{DIFF}$ current is ten times the magnitude of the $I_{OFF}$ current. However, other ratios of $I_{DIFF}$ and $I_{OFF}$ may be employed without departing from the spirit of the invention.

The sum of the current $I_{DIFF}$ and the off current $I_{OFF}$ of the photodiode 7 defines the nominal current that passes through the photodiode when the laser is turned on and the DC bias is properly adjusted. Thus, it will be appreciated by those skilled in the art that the transistors Q1 and Q5 operate as current sources.

The transistors Q1 and Q5 are employed to provide stable current sources that will operate over a wide range of temperatures. However, it should be appreciated that either or both of the transistors Q1 and Q5 may be replaced by suitable resistors to provide a somewhat less stable current source, without departing from the spirit of the invention.

When the injection laser 1 is turned on, the absence of a $\overline{\text{DATA}}$ signal causes a Schottky diode 9 to be biased to conduct the $I_{DIFF}$ current from the node A to the conducting transistor Q1 and a resistor 10. The transistor Q5 also conducts to pass the current $I_{OFF}$. An error current corresponding to the difference between the photodiode current and the sum of $I_{DIFF}$ and $I_{OFF}$ is passed through the resistor 11 and is applied to an operational amplifier 13 and associated capacitor 15 that integrates the error current so that the total difference in charge transfer is stored in the capacitor 15. Thus, the operational amplifier 13 and capacitor 15 generate a voltage that corresponds to the total difference in charge transfer between the photodiode and the transistors Q1 and Q5.

The stored voltage of the capacitor 15 is applied to the base of a transistor Q4 to turn on the transistor and to thereby adjust the conducting state of the transistor so that a particular associated DC bias current is applied to the laser 1.

It should be understood that when a relatively large error current is flowing through the resistor 11, the transistor Q4 is weakly turned on and, therefore, a small current flows through the transistor Q4. Likewise, when a smaller error current flows through the resistor 11, the transistor Q4 is operated by the operational amplifier 13 and capacitor 15 to conduct a relatively larger amount of current.

When the laser is turned off in response to the $\overline{\text{DATA}}$ signal, a Schottky diode 17 is biased to conduct so that the transistor Q1 pulls current through the diode 17 rather than through the diode 9. Thus, the Schottky diodes 9 and 17 operate as a current switch that is controlled by the $\overline{\text{DATA}}$ signal that turns off the laser 1.

The switching action of the Schottky diodes 9 and 17 causes the output of the photodiode 7 to be sampled, and the difference in charge transfer stored, when the laser is turned on. Thus, the Schottky diodes 9 and 17 operate to adjust the DC bias of the laser when the laser is turned on, and, therefore, the circuit of FIG. 1 operates to control the peak optical output of the laser rather than the average power of the laser.

The "off" state of the laser 1 is defined at a particular low energization of the laser so that when the laser is off, a low level of radiation is applied to the photodiode 7. The circuit of FIG. 1 is calibrated so that the small off current $I_{OFF}$ flows through the photodiode when the laser is operated in the off state. As explained previously, when the laser is in the off state, the diode 9 blocks the flow of current from the photodiode to Q1 and the diode 17 passes an alternate current to Q1. When the laser is off, the $I_{OFF}$ current that flows through the photodiode 7 is shunted to the minus voltage portion of the circuit through the conducting transistor Q5.

Thus, while the laser is on, the transistor Q4 applies an adjusted DC bias current that is proportional to the charge transfer difference that is stored on the capacitor 15. When the laser is operated in the off state, the DC bias current is maintained at the level set during the previous on state, since the capacitor retains its charge.

It should be understood that the circuit of FIG. 1 provides a DC current feedback signal that closely follows the "on" optical output of the injection laser 1 and, therefore, is not subject to feedback errors caused by changes in the duty cycle of the data signal or changes in the control pattern of the signal. Also, since the control circuit of FIG. 1 operates in response to small changes in charge accumulation with respect to the photodiode, the photodiode may be operated with a relatively smaller reverse bias voltage than is required for providing a distinct waveform at the output of the photodiodes of prior art systems.

Moreover, when loss of data occurs, the control loop of FIG. 1 operates to hold the peak optical output of the injection laser 1 constant until a data input is resumed, since the output of the operational amplifier 13 and the capacitor 15 will be maintained constant until new data signals are applied to adjust the level of the integrated voltage at the capacitor 15.

A reference voltage Vr is applied at the positive terminal of the operational amplifier 13. The reference voltage Vr may typically be set at a voltage level that is halfway between the voltage levels of the data signals that are applied to the circuit of the invention. For an experimental circuit, the voltage swing of DATA or $\overline{\text{DATA}}$ signals was set to range from 0.8 volts to 1.8 volts. Therefore, for such a circuit, the reference voltage Vr is approximately $-1.3$ volts. However, other reference voltages may be employed without departing from the spirit of the invention. In addition, it should be understood that the ground connection for the photodiode and laser of FIG. 1 may be suitably replaced by a positive voltage connection, without departing from the invention.

Figure 2:
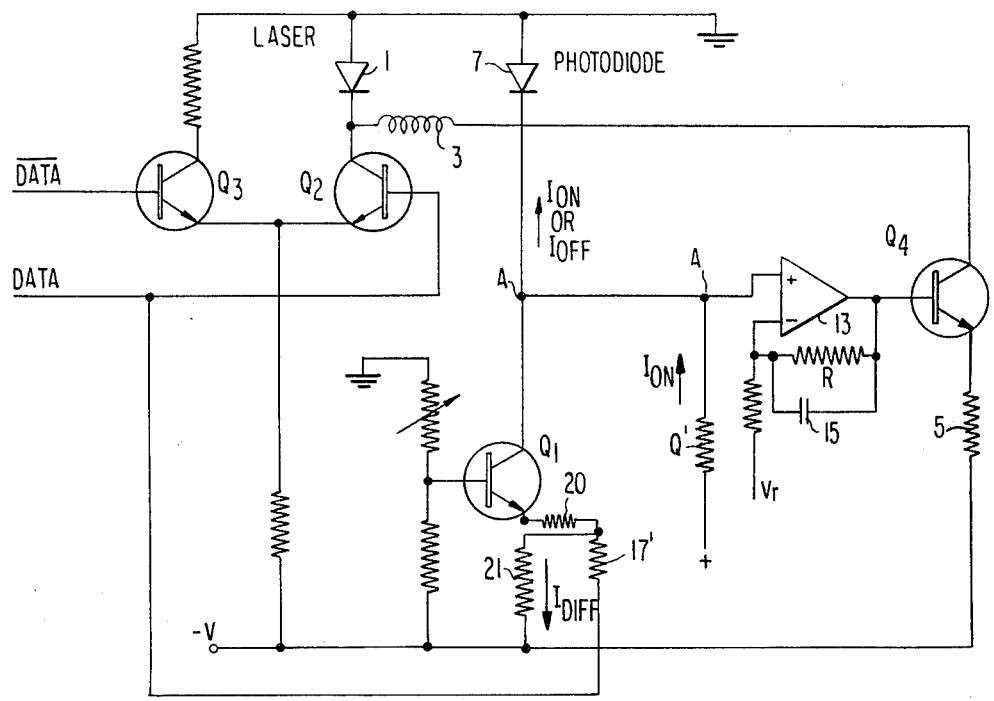
FIG. 2 illustrates a second and preferred embodiment.

FIG. 2 illustrates a preferred embodiment of the invention, and as will be pointed out below, operates on a principle similar to that used by the circuit of FIG. 1.

As shown in FIG. 2 the laser 1 is driven by DATA and $\overline{\text{DATA}}$ signals through Q2 and Q3 just as in FIG. 1. However, the current source Q5 has been replaced by a large resistor Q′ connected to a positive source to act as a current source for a current $I_{ON}$ that is equivalent to the photodiode current when the laser is on and operating at the appropriate bias. The current source Q1 is altered by eliminating diodes 9 and 17, replacing the latter with a large resistor 17′ returned to DATA (as opposed to $\overline{\text{DATA}}$). The source Q1 is dimensioned to sink a current $I_{DIFF}$, equal to the difference in $I_{ON}$ and $I_{OFF}$, the former defined above, the latter corresponding to photodiode current with the laser off. In addition, the resistor 17′ is returned to Q1's emitter rather than the collector through resistor 20. The combination of resistors 20, 17′ and 21 provide a relatively stable current source. Those skilled in the art will appreciate that still other current sources could be used.

Other circuit changes include a reversal in polarity of the photodiode, elimination of the resistor 11, addition of a feedback resistor R to the OP amp 13, connected between its negative input terminal and output, with the voltage reference Vr connected through a further resistor to the same terminal. The signal input to OP amp 13 is now via its + input terminal.

In the laser off state Q1 and Q3 are on, Q2 is off and Q4 is controlled in accordance with the integrator output. The $I_{ON}$ current supplied by Q′ splits at node A into $I_{OFF}$ flowing through photodiode and $I_{DIFF}$ in Q1. Since the parameters are proportioned in this fashion, no current is input to OP amp 13 and so its output voltage does not change.

When the laser is in the on state, Q1 and Q3 are off, Q2 is on and Q4 is controlled as follows. The fixed $I_{ON}$ from Q′ flows into node A. The photodiode current depends on laser illumination. If the laser is operating with the appropriate bias current, $I_{ON}$ and photodiode current are equal, and no current flows to the OP amp 13. On the other hand, any variation in laser illumination produces current flow into or out of the OP amp, the polarity depending on the relation of photodiode current and $I_{ON}$. This current or error current is integrated and produces a change in output voltage of OP amp 13 which changes the bias current to laser 1 to compensate for the excessive or diminished laser illumination causing the error current.

Thus, it should be apparent that common to both embodiments is a laser control circuit which monitors laser output when on to effect changes in the bias current. In one embodiment a fixed current source (Q5) supplies $I_{OFF}$ and a switched current source (Q1) supplies the difference between $I_{ON}$ and $I_{OFF}$. In the other embodiment a fixed source supplies $I_{ON}$ (Q′) and the switched source sinks the difference $I_{DIFF}$.

The invention may be embodied in other specific forms without departing from its spirit or essential characteristics. The present embodiments are, therefore, to be considered in all respects as illustrative and not restrictive, the scope of the invention being indicated by the claims rather than by the foregoing description, and all changes which come within the meaning and range of the equivalents of the claims are therefore intended to be embraced therein. For example, the current source $Q^1$ (FIG. 2) could be implemented with an active device or the source Q1 could be implemented via a resistor and diode to effect a similar end result.

What is claimed is:

1. Apparatus for controlling a bias current of a laser at an appropriate operating point, comprising:
    means for operating a laser either in an ON state or an OFF state in response to corresponding data signals,
    photodiode means for receiving at least a portion of radiation emitted by a laser to be so controlled and for passing a photodiode current corresponding to incident radiation,
    a current node coupled to said photodiode means,
    a fixed source of current of magnitude $I_{ON}$, said magnitude $I_{ON}$ corresponding to a photodiode current produced by a laser in said ON state and biased at an appropriate operating point, said fixed source of current also coupled to said node,
    current source means for generating a current of magnitude of zero or $I_{DIFF}$, where $I_{DIFF}$ is a difference between $I_{ON}$ and $I_{OFF}$, where $I_{OFF}$ is a photodiode current produced by a laser to be so controlled in an OFF state operating at an appropriate bias point, said current source means also connected to said node, and processing means responsive to a net current coupled to said node for deriving said bias current for said laser to be so controlled, wherein said processing means includes an integrator for integrating said net current and producing a signal corresponding to said net integrated current, and means responsive to said net integrated current for producing a bias current inversely proportional thereto.

2. The apparatus of claim 1 wherein said fixed source of current comprises a resistor current source.

3. The apparatus of claim 2 in which said current source means includes a transistor biased to conduct $I_{DIFF}$ with an emitter coupled to a signal switching said laser to an ON state.

4. The device of claim 1 where said current source means includes means responsive to said data signals for either generating said current $I_{DIFF}$ or zero, in dependence on said data signals.

* * * * *